(12) United States Patent
Zhou et al.

(10) Patent No.: US 9,343,481 B2
(45) Date of Patent: May 17, 2016

(54) TFT ARRAY SUBSTRATE AND MANUFACTURING METHOD THEREOF AND LIQUID CRYSTAL DISPLAY DEVICE

(71) Applicant: Xiamen Tianma Micro-Electronics Co., Ltd., Xiamen (CN)

(72) Inventors: Xiufeng Zhou, Xiamen (CN); Junyi Li, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 110 days.

(21) Appl. No.: 14/228,215

(22) Filed: Mar. 27, 2014

(65) Prior Publication Data

US 2014/0211118 A1    Jul. 31, 2014

Related U.S. Application Data

(63) Continuation of application No. PCT/CN2013/075414, filed on May 9, 2013.

(30) Foreign Application Priority Data

Sep. 24, 2012   (CN) .......................... 2012 1 0357758

(51) Int. Cl.
    *H01L 27/12*   (2006.01)
    *G02F 1/1343*  (2006.01)
    *G02F 1/1362*  (2006.01)

(52) U.S. Cl.
    CPC ........ *H01L 27/124* (2013.01); *G02F 1/134363* (2013.01); *H01L 27/1248* (2013.01);
    (Continued)

(58) Field of Classification Search
    CPC .................... G02F 1/136286; G02F 1/134363; G02F 1/136209
    See application file for complete search history.

(56) References Cited

U.S. PATENT DOCUMENTS

| 2004/0263754 A1 | 12/2004 | Ahn et al. |
| 2007/0284627 A1 | 12/2007 | Kimura |

(Continued)

FOREIGN PATENT DOCUMENTS

| CN | 101075051 A | 11/2007 |
| CN | 102135691 A | 7/2011 |

(Continued)

OTHER PUBLICATIONS

Extended European Search Report as issued in corresponding European Application No. 13839916.7, dated Jan. 27, 2015.

*Primary Examiner* — Richard Kim
*Assistant Examiner* — Kendrick Hsu
(74) *Attorney, Agent, or Firm* — Alston & Bird LLP

(57) ABSTRACT

The present invention discloses a TFT array substrate and a manufacturing method thereof and a liquid crystal display device, which is aiming at lowering the resistance value of a common electrode and not diminishing the aperture ratio of pixels on the premise that the manufacturing cost is not additionally increased. The TFT array substrate includes: a substrate, a common electrode layer arranged on the substrate, a first insulating layer arranged on the common electrode layer and a plurality of pixel electrodes arranged in an array on the first insulating layer, wherein via holes penetrating through the first insulating layer are formed between adjacent pixels in some of a plurality of pixels, and common electrode lines are grown between rows and/or columns of pixels in some of the plurality of pixels, and in parallel with the common electrode layer below the first insulating layer through the via holes.

14 Claims, 2 Drawing Sheets

(52) U.S. Cl.
CPC ...... *H01L27/1296* (2013.01); *G02F 1/136227* (2013.01); *G02F 1/136286* (2013.01); *G02F 2001/134372* (2013.01); *G02F 2201/40* (2013.01)

(56) References Cited

U.S. PATENT DOCUMENTS

| | | | |
|---|---|---|---|
| 2009/0091672 A1* | 4/2009 | Seok et al. | 349/39 |
| 2010/0328595 A1 | 12/2010 | Tojo et al. | |
| 2011/0102724 A1* | 5/2011 | Ono | 349/143 |
| 2012/0133858 A1 | 5/2012 | Shin et al. | |
| 2012/0305947 A1* | 12/2012 | Lee | 257/88 |
| 2013/0300968 A1* | 11/2013 | Okajima et al. | 349/43 |

FOREIGN PATENT DOCUMENTS

| | | |
|---|---|---|
| CN | 102566174 A | 7/2012 |
| CN | 102651371 A | 8/2012 |
| CN | 102654703 A | 9/2012 |
| WO | 2012102158 A1 | 8/2012 |

* cited by examiner

TFT ARRAY SUBSTRATE AND MANUFACTURING METHOD THEREOF AND LIQUID CRYSTAL DISPLAY DEVICE

CROSS-REFERENCES TO RELATED APPLICATIONS

This application claims priority to and is a continuation of PCT/CN2013/075414, filed on May 9, 2013 and entitled "TFT ARRAY SUBSTRATE AND MANUFACTURING METHOD THEREOF AND LIQUID CRYSTAL DISPLAY DEVICE", which application claims the benefit of Chinese Patent Application No. 201210357758.1, filed with the Chinese Patent Office on Sep. 24, 2012 and entitled "TFT ARRAY SUBSTRATE AND MANUFACTURING METHOD THEREOF AND LIQUID CRYSTAL DISPLAY DEVICE", the contents of which are incorporated herein by reference in their entirety.

FIELD

The invention relates to the field of liquid crystal display technologies, and particularly to a Thin Film Transistor (TFT) array substrate, a method of manufacturing the TFT array substrate, and a liquid crystal display device.

BACKGROUND OF THE INVENTION

The method of manufacturing a TFT array substrate is similar to that of manufacturing a very large-scale integrated circuit. The method is based on a plane drawing process, in which conversion of designed patterns is implemented according to a designed mask plate on a glass substrate, and a series of steps of adding and removing film materials are performed according to the patterns to be formed.

With the structure of the existing TFT array substrate, the resistance value of a common electrode layer made of the existing material is generally very high, so the loads of respective points in a plane are different, thus affecting the voltages of the respective points in the plane, leading to flicker or serious crosstalk in the plane and adversely affecting the picture quality of a panel. One solution in the prior art is to design a metal line in parallel with a gate line on the same layer when the gate line is made and electrically connect the metal line with the common electrode layer through a via hole, so as to reduce the resistance value of the common electrode layer. However, such design may greatly affect the edge distance of pixels and lead to the decline of an aperture ratio. Another solution is to directly make a metal layer on the common electrode layer in direct contact with the metal layer to reduce the resistance value of the common electrode layer. As this solution requires additional processes, the production cost is increased.

Moreover, due to rapid development of the liquid crystal technologies, the size of the TFT array substrate is made smaller and smaller. Thus how to improve the aperture ratio while reducing the resistance value of the common electrode layer effectively so as to achieve the objective of improving the display effect is an increasingly severe task.

BRIEF SUMMARY OF THE INVENTION

Embodiments of the invention provide a TFT array substrate, a method of manufacturing the TFT array substrate, and a liquid crystal display device to achieve the objectives of lowering the resistance value of a common electrode layer while not reducing the aperture ratio of pixels on the premise that the manufacturing cost is not additionally increased.

A TFT array substrate provided in an embodiment of the invention includes: a substrate, a common electrode layer arranged on the substrate, a first insulating layer arranged on the common electrode layer and a plurality of pixel electrodes arranged in an array on the first insulating layer, wherein via holes penetrating through the first insulating layer are formed between two adjacent pixels in some of a plurality of pixels, and common electrode lines are grown between two rows and/or columns of pixels in some of the plurality of pixels and in parallel with the common electrode layer below the first insulating layer through the via holes.

A liquid crystal display panel provided in an embodiment of the invention includes the above-mentioned TFT array substrate.

A liquid crystal display device provided in an embodiment of the invention includes the above-mentioned liquid crystal display panel.

A method of manufacturing a TFT array substrate provided in an embodiment of the invention includes:

forming, on a substrate according to a drawing process, a semiconductor layer, a gate, a source, a drain, gate lines and data lines of a TFT, and an organic layer with first via holes on the source and the drain;

forming a common electrode layer on the organic layer;

forming a first insulating layer on the common electrode layer and the organic layer, forming second via holes in the first insulating layer at positions corresponding to the first via holes, and forming third via holes at areas not forming pixels afterwards in the first insulating layer above the common electrode layer;

forming pixel electrodes on the first insulating layer through the second via holes;

growing common electrode lines between two rows and/or columns of pixels in some of a plurality of pixels through the third via holes.

According to the embodiments of the invention, a plurality of common electrode lines and a plurality of via holes are arranged on the first insulating layer above the common electrode layer, and the common electrode lines are in contact with the common electrode layer through the via holes, so that the objective of lowering the resistance of the common electrode layer is achieved, and the display effect of the liquid crystal display is improved; as the third via holes and the common electrode lines are preferably arranged above the data lines and/or the gate lines, the grown common electrode lines do not affect the aperture ratio of the pixels; and since the third via holes and the common electrode lines are manufactured in the last step of the manufacturing flow and arranged on the top layer, the manufacturing process is relatively simple, and the cost is relatively low.

DETAILED DESCRIPTION OF THE INVENTION

Embodiments of the present invention provide a TFT array substrate, a method of manufacturing the TFT array substrate, and a liquid crystal display device, which can achieve the objectives of lowering the resistance value of a common electrode layer while not reducing the aperture ratio of pixels on the premise that the manufacturing cost is not additionally increased, so as to improve the display effect of the liquid crystal display equipment.

Embodiment 1

Figure 1:
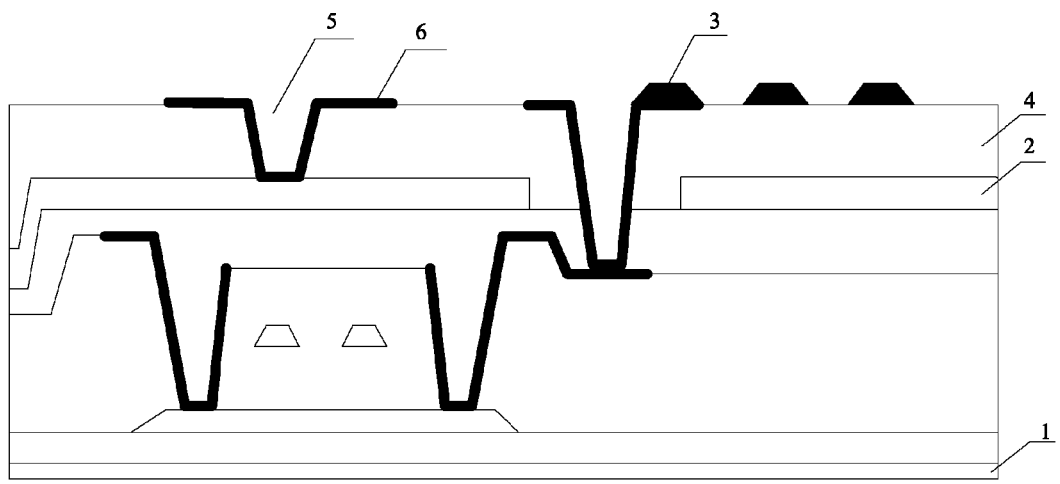
FIG. 1 is a sectional schematic diagram of a pixel of a TFT array substrate provided according to an embodiment of the invention.

As illustrated in FIG. 1, an embodiment of the invention provides a TFT array substrate, which mainly includes: a substrate 1, a common electrode layer 2 arranged on the substrate 1, a first insulating layer 4 arranged on the common electrode layer 2 and a plurality of pixel electrodes 3 arranged in an array on the first insulating layer 4, wherein via holes 5 penetrating through the first insulating layer 4 are formed between adjacent pixels in some of a plurality of pixels, and common electrode lines 6 are grown between rows and/or columns of pixels in some of the plurality of pixels, and in parallel with the common electrode layer 2 located below the first insulating layer 4 through the via holes 5.

A plurality of common electrode lines and a plurality of via holes are arranged on the first insulating layer above the common electrode layer in the embodiment of the invention, and the common electrode lines are in contact with the common electrode layer through the via holes, so that the objective of lowering the resistance of the common electrode layer is achieved, and the display effect is improved. Since the common electrode lines, the via holes and the pixel electrodes are located on the same layer, namely the surface layer, the common electrode lines can be formed in the last step of a manufacturing process, a manufacturing cost is low.

In order to introduce the technical solution of the invention clearly and purposely, some structures included in a conventional TFT array substrate are omitted in the above-mentioned embodiment. The structure of a TFT array substrate of an embodiment of the invention will be introduced below, using a top gate type TFT array substrate as an example.

Figure 2:
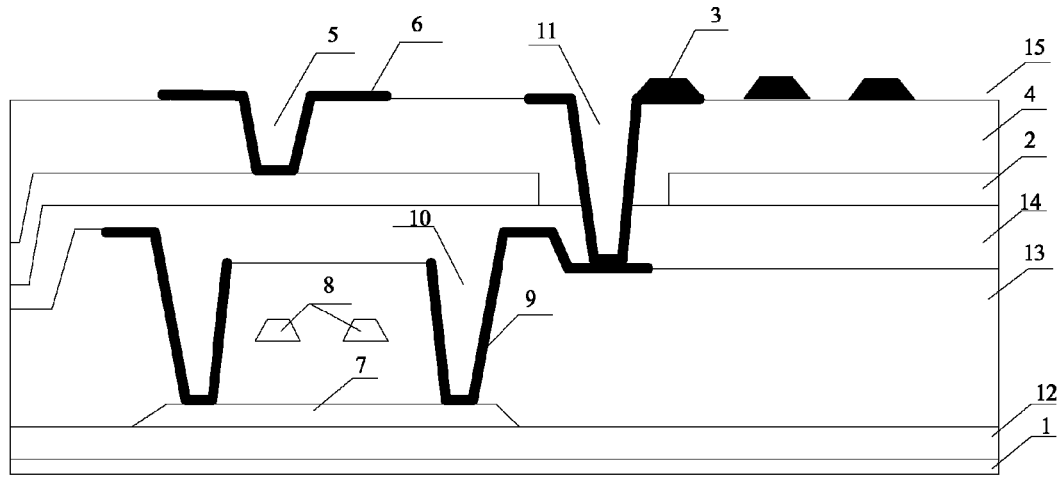
FIG. 2 is a sectional schematic diagram of a pixel of a top gate type TFT array substrate according to an embodiment of the invention.

As illustrated in FIG. 2, the TFT array substrate includes a substrate 1 and respective layers on the substrate 1. The respective layers are following in order: a semiconductor layer 7; a gate layer (including a gate and gate lines) 8; a source, drain and data line layer (including a source, a drain and data lines) 9; a common electrode layer 2; and a common electrode line and pixel electrode layer 15 (including common electrode lines 6 and pixel electrodes 3). An insulating layer for isolating is arranged between every two above-described layers, and positions to be contacted electrically are in contact with each other in a conventional channel or via hole known by those skilled in the art. For example, as illustrated in FIG. 2, an insulating layer 14 is arranged between the source, drain and data line layer 9 and the common electrode layer 2. The insulating layer 14 is preferably an organic layer 14; a first insulating layer 4 is arranged between the common electrode layer 2 and the common electrode line and pixel electrode layer 15; and a third insulating layer 13 is arranged between the source, drain and data line layer 9 and the semiconductor layer 7.

It should be noted that the third insulating layer 13 may include respective insulating layers between every two of the semiconductor layer 7, the gate layer 8 and the source, drain and data line layer 9. For example, the third insulating layer 13 may include a semiconductor insulating layer between the semiconductor layer 7 and the gate layer 8 and a gate insulating layer between the gate layer 8 and the source, drain and data line layer 9.

Preferably, in order to prevent the semiconductor layer 7 from being polluted in the manufacturing process, a second insulating layer 12 is arranged between the substrate 1 and the semiconductor layer 7.

As illustrated in FIG. 2, the data lines are electrically connected with the semiconductor layer 7 through source and drain via holes 10, that are formed in the third insulating layer 13 at locations of the source and the drain. The pixel electrodes 3 are electrically connected with the data lines through deep via holes 11 that are formed by first via holes in the organic layer 14 and second via holes in the first insulating layer 4 at locations of the first via holes. The common electrode lines 6 are electrically connected with the common electrode layer 2 through third via holes 5, such that the resistance of the common electrode layer 2 is lowered.

It should be noted that a number of the third via holes and the common electrode lines in the embodiment of the invention may be arbitrary chosen and can be defined according to the application requirement or the cost requirement. The third via holes and the common electrode lines may be formed between some pixels but not between the other pixels and only need to be formed between pixels rather than into the pixels. For example, the third via holes and the common electrode lines may be formed above the data lines or gate lines between some of the pixels, in order not to affect the transmittance.

The pixels herein are referred to as display areas encircled by the gate lines and the data lines, as commonly known by those skilled in the art. As known, a liquid crystal device may have an array of pixels arranged in rows and columns, a number of gate lines are arranged along rows of the pixels, and a number of data lines are arranged along columns of the pixels.

Preferably, in order to achieve a better technical effect, a third via hole in the first insulating layer is formed between every two adjacent pixels, and a common electrode line is grown between every two adjacent rows and/or columns of pixel electrodes. Under this preferable condition, the common electrode lines may be distributed in a net shape.

According to requirements, one or more than one third via holes may be formed between the every two adjacent pixels.

The third via hole may have any shape. As molecules are circular, the third via hole is preferably a circular hole, and the diameter of the circular hole should be smaller than the width of the common electrode line, so that the third via hole is fully filled with the common electrode line in the growing (filling) process.

The common electrode lines and the common electrode layer may be made of a transparent conductive material, preferably indium tin oxide.

Preferably, the projections of the data lines and/or the gate lines in the direction perpendicular to the substrate superpose on the projections of the common electrode lines and the third via holes in the direction perpendicular to the substrate, so that the grown common electrode lines do not affect the aperture ratio of the pixels. As known by those skilled in the art, the perpendicular projections of the gate lines do not superpose on the data lines on the substrate.

Preferably, if the resistance needs to be further reduced, a metal layer or an alloy layer in direct contact with the common electrode lines can be formed on the common electrode lines, to further achieve the objective of lowering the resistance of the common electrode layer.

The metal layer and the alloy layer are made of some common materials in the art, preferably, the metal layer can made of molybdenum, copper, aluminum or titanium, and the alloy layer can made of an aluminum-neodymium alloy.

Figure 3:
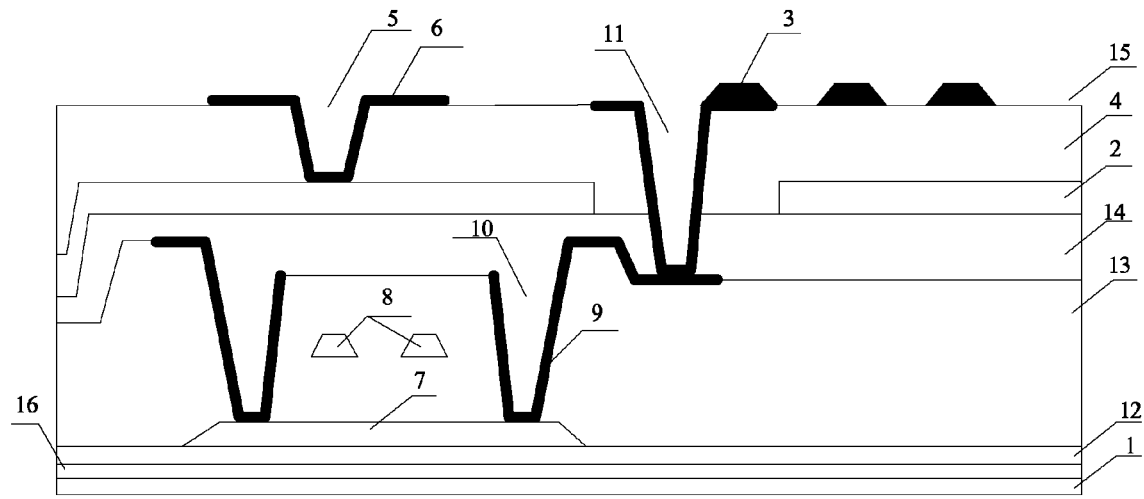
FIG. 3 is a sectional schematic diagram of a pixel of the top gate type TFT array substrate according to an embodiment of the invention.

Preferably, in order to prevent the TFT array substrate from producing leakage current caused by light leakage, the TFT array substrate may also include a shading layer between the second insulating layer and the substrate. As shown in FIG. 3, this structure is formed on the substrate 1 successively by the following layers: a light shading layer 16, a second insulating layer 12, a semiconductor layer 7, a semiconductor insulating layer, a gate layer 8, a gate insulating layer, a source, drain and data line layer 9, an organic layer 14, a common electrode layer 2, a first insulating layer 4 and a common electrode line and pixel electrode layer 15.

As a variation of the aforementioned embodiment, the TFT array substrate may also be a bottom gate type TFT array substrate. The difference between the bottom gate type TFT array substrate and the TFT array substrate of the aforementioned embodiment is that the gate layer 8 and then the semiconductor layer 7 are successively formed on the substrate 1 in this embodiment, and the bottom gate type TFT array substrate may be manufactured by using a method described in embodiment 4 below. The structures of the bottom gate type and top gate type TFT array substrates do not have other distinction except the relative positions of the gate layer and the semiconductor layer, thus the structure of the bottom gate type TFT array substrate will not be described herein.

An embodiment of the invention further provides a liquid crystal display panel, mainly including the TFT array substrate in any of the above-mentioned technical solutions.

An embodiment of the invention further provides a liquid crystal display panel including the TFT array substrate in any of the above-described technical solutions, a time sequence driver, a gate driver, a data driver and a color filter substrate.

The gate driver is connected with the gate lines on the TFT array substrate, and the data driver is connected with the data lines on the TFT array substrate.

The time sequence driver is arranged on a printed circuit board (PCB) to provide driving signals for the gate driver and the data driver.

The TFT array substrate is electrically connected together with the PCB through the gate driver and the data driver.

The color filter substrate is arranged opposite to the array substrate and may electrically connected with the TFT array substrate through conductive adhesive.

A liquid crystal is filled between the color filter substrate and the TFT array substrate to form the liquid crystal display panel.

An embodiment of the invention also provides a liquid crystal display including the above-described liquid crystal display panel and a backlight unit for providing a light source.

Based on the TFT array substrate introduced in the above-mentioned embodiments of the invention, an embodiment of the invention further provides a method of manufacturing the TFT array substrate. As illustrated in FIG. 2, the method includes:

forming on a substrate 1 a semiconductor layer 7, a gate and gate lines 8, a source, a drain and data lines 9 of a TFT, and an organic layer 14 having first via holes formed above the source and the drain;

forming a common electrode layer 2 on the organic layer 14;

forming a first insulating layer 4 on the common electrode layer 2 and the organic layer 14, and forming second via holes matched with the first via holes in the first insulating layer 4 at positions corresponding to the first via holes, wherein the first via holes and the second via holes together form deep via holes 11; forming third via holes 5 in the first insulating layer 4 above the common electrode layer 2 at an area not to form pixel electrodes 3 afterwards;

forming the pixel electrodes 3 on the first insulating layer 4 through the deep via holes 11;

growing common electrode lines 6 between rows and/or columns of pixels in some of a plurality of pixels through the third via holes 5.

According to the embodiment of the invention, the third via holes 5 and the common electrode lines 6 are formed at the last step of the process flow, and the common electrode lines 6 are in parallel with the common electrode layer 2 to lower the resistance of the common electrode layer 2 and improve the final picture quality of the liquid crystal display.

As the manufacturing method of the invention is suitable for manufacturing the top gate type and bottom gate type TFT array substrates, respective manufacturing flows are introduced in detail below with the accompanying drawings:

Embodiment 2

As illustrated in FIG. 2, the top gate type TFT array substrate can be manufactured as follows.

A semiconductor structure (e.g., a semiconductor layer 7) of a TFT is formed on a substrate 1. Specifically, a semiconductor active layer made of amorphous silicon (a-Si) may be formed by a chemical vapor deposition process. The amorphous silicon for the semiconductor active layer is merely taken as an example in this embodiment, but the semiconductor active layer is not limited to the amorphous silicon, and in another embodiment, after the semiconductor active layer is formed, an ohmic contact layer on the semiconductor active layer is formed using a chemical vapor deposition process. After exposure, development and etching, the semiconductor active layer or the semiconductor active layer and the ohmic contact layer thereon are patterned to form the semiconductor structure (the semiconductor layer 7) of the TFT.

A semiconductor insulating layer is formed on the semiconductor structure (the semiconductor layer 7) using a chemical vapor deposition process.

A gate of the TFT and gate lines are formed on the semiconductor insulating layer to form a gate layer 8.

A gate insulating layer covering the gate layer 8 is formed on the semiconductor insulating layer, the gate and the gate lines. Source and drain via holes 10 are correspondingly formed at the positions where a source and a drain of the TFT are formed later. The source and drain via holes 10 expose a portion of the semiconductor structure (the semiconductor layer) 7.

The source and the drain of the TFT are formed on the gate insulating layer through the source and drain via holes 10 after the steps of metal deposition, exposure, development and etching, and data lines are further arranged, so as to form a source, drain and data line layer 9.

An organic layer 14 covering the source and the drain of the TFT is formed.

A common electrode layer 2 is formed on the organic layer 14 using a metal sputtering process; the common electrode layer 2 is not formed at the positions of first via holes and second via holes etched later for connecting the drain of the TFT and the pixel electrodes.

A first insulating layer 4 is grown on the common electrode layer 2. The second via holes, third via holes 5 are formed meanwhile, and a plurality of pixel electrodes 3 arranged in an array are formed on the first insulating layer 4. The second via holes go through the first insulating layer 4 and are matched with the first via holes. The second via holes together with the first via holes form deep via holes 11. The third via holes 5 go through the first insulating layer 4 and are formed between some adjacent pixels.

The pixel electrodes 3 arranged in the array are formed on the first insulating layer 4 through the deep via holes 11; and common electrode lines 6 are formed corresponding to an area between rows and/or columns of some pixels on the first insulating layer 4 through the third via holes 5.

Embodiment 3

Referring to FIG. 3, the difference between embodiment 3 and embodiment 2 is that a light shading layer 16 is first formed on the substrate 1 before the semiconductor layer 7 is formed to prevent the TFT array substrate from light leakage. Further, after the light shading layer 16 is formed, a second insulating layer 12 is formed on the substrate 1, to prevent the substrate 1 from polluting the following semiconductor layer 7.

Embodiment 4

Figure 4:
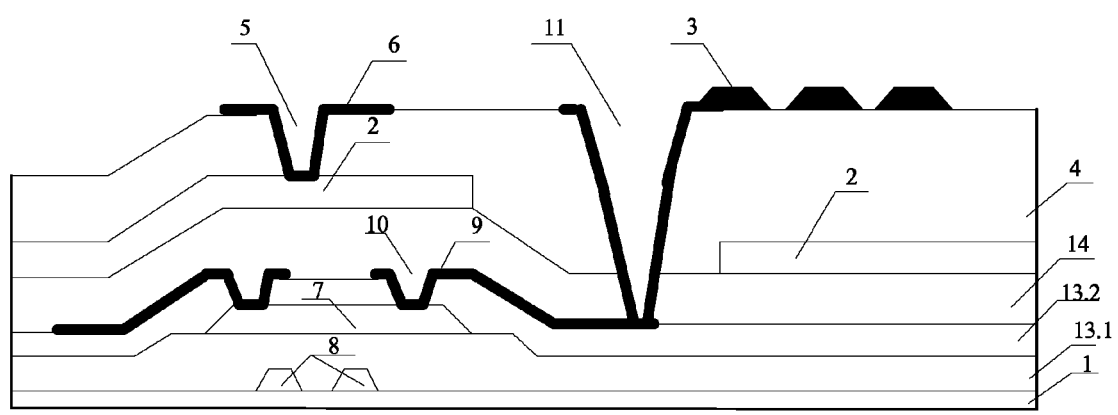
FIG. 4 is a sectional schematic diagram of a pixel of a bottom gate type TFT array substrate according to an embodiment of the invention.

As a variation of embodiment 2, FIG. 4 illustrates a manufacturing flow of a bottom gate type TFT array substrate, which is similar to the manufacturing flow of the top gate type TFT array substrate, while the difference is mainly embodied on the manufacturing of a TFT element:

firstly, a gate and arrangement of gate lines are formed on a substrate 1 to form a gate layer 8, a gate insulating layer 13.1 covering the gate layer 8 is formed on the gate and the gate lines;

a semiconductor layer 7 is formed on the gate insulating layer 13.1 using a metal sputtering process;

a semiconductor insulating layer 13.2 is formed on the semiconductor layer 7 by a chemical vapor deposition process, and source and drain via holes 10 are correspondingly formed at the positions where a source and a drain of the TFT will be formed later;

the source and the drain of the TFT are formed on the semiconductor insulating layer 13.2 through the source and drain via holes 10 after the steps of metal deposition, exposure, development and etching, and data lines are further arranged to form a source, drain and data line layer 9;

an organic layer 14 covering the source and the drain of the TFT is formed, with first via holes formed in the organic layer 14 at the positions where pixel electrodes will be formed later;

a common electrode layer 2 is formed on the organic layer 14 using a metal sputtering process; the common electrode layer 2 is not formed at the positions of the second via holes etched later for electrically connecting the drain of the TFT and the pixel electrodes;

a first insulating layer 4 is formed on the common electrode layer 2, the second via holes and third via holes 5 are formed in the first insulating layer 4; the second via holes go through the first insulating layer 4 at the locations of the first via holes to form deep via holes 11 together with the first via holes, and the third via holes 5 go through the first insulating layer 4 and may be formed between some adjacent pixels;

pixel electrodes 3 arranged in an array are formed on the first insulating layer 4 through the deep via holes 11; and common electrode lines 6 are grown in correspondence to an area between rows and/or columns of pixels in some of the plurality of pixels on the first insulating layer 4 through the third via holes 5.

Preferably, in the above-mentioned embodiment, the third via holes are formed in the first insulating layer 4 between every two adjacent pixels, and a common electrode line is grown between every two adjacent rows and/or columns of pixels, and the common electrode lines may be distributed in a net shape.

According to requirements, one or more than one third via holes may be formed between the every two adjacent pixels.

On the whole, the shape of the third via hole is not strictly required. As molecules are circular, the third via hole is preferably a circular hole, and the diameter of the circular hole is smaller than the width of the common electrode line.

The common electrode lines and the common electrode layer may be made of a transparent conductive material, preferably indium tin oxide.

Preferably, the projections of the data lines and/or the gate lines in the direction perpendicular to the substrate cover the projections of the common electrode lines and the third via holes in the direction perpendicular to the substrate, so that the grown common electrode lines do not affect the aperture ratio of the pixels, and the perpendicular projections of the gate lines and the data lines on the substrate are not superposed.

Embodiment 5

This embodiment is formed on the base of embodiment 2. The difference from embodiment 2 is that, to further lower the resistance, a metal layer or an alloy layer in direct contact with the common electrode lines is formed on the common electrode lines after the common electrode lines are formed, to further achieve the objective of lowering the resistance value of the common electrode layer.

The metal layer and the alloy layer are made of some common materials in the art, preferably, the metal layer may be made of molybdenum, copper, aluminum or titanium, and the alloy layer may be made of an aluminum-neodymium alloy.

In conclusion, according to the embodiments of the invention, a plurality of common electrode lines and a plurality of third via holes are arranged on the first insulating layer on the common electrode layer, and the common electrode lines are in contact with the common electrode layer through the third via holes, so that the objective of lowering the resistance of the common electrode layer is achieved, and the display effect of the liquid crystal display device is improved; as the third via holes and the common electrode lines are preferably arranged above the data lines and/or the gate lines, the grown common electrode lines do not affect the aperture ratio of the pixels; and since the third via holes and the common electrode lines only need to be manufactured in the last step of the manufacturing flow and are arranged on the top layer of the array substrate, the manufacturing process is relatively simple, and the cost is relatively low.

Evidently those skilled in the art can make various modifications and variations to the invention without departing from the spirit and scope of the invention. Thus, the invention is also intended to encompass these modifications and variations thereto so long as the modifications and variations fall within the scope of the appended claims and their equivalents.

What is claimed is:

1. A Thin Film Transistor (TFT) array substrate having a plurality of pixels arranged in rows and columns, the TFT array substrate comprising:
    a substrate;
    a common electrode layer arranged on the substrate;
    a first insulating layer arranged on the common electrode layer;
    an array of pixel electrodes arranged on the first insulating layer;
    a plurality of via holes in the first insulating layer between at least some of adjacent pixels; and a plurality of common electrode lines between at least some of the rows and/or the columns of pixels and electrically connected with the common electrode layer through the via holes;

wherein projections of data lines and/or gate lines superpose on projections of the common electrode lines in a direction perpendicular to the substrate and the via holes in the direction perpendicular to the substrate, and wherein perpendicular projections of the gate lines do not superpose on the data lines on the substrate.

2. The TFT array substrate of claim 1, wherein one or more via holes are formed between every two adjacent pixels, and a common electrode line is formed between every two adjacent rows and/or columns of pixels.

3. The TFT array substrate of claim 2, wherein the one or more via holes are circular holes each having a diameter smaller than a width of a common electrode line.

4. The TFT array substrate of claim 1, wherein the common electrode lines and the common electrode layer are made of a transparent conductive material.

5. The TFT array substrate of claim 4, wherein the transparent conductive material is indium tin oxide.

6. The TFT array substrate of claim 1, further comprising a metal layer or an alloy layer in direct contact with the common electrode lines.

7. The TFT array substrate of claim 6, wherein the metal layer is made of molybdenum, copper, aluminum or titanium, and the alloy layer is made of an aluminum-neodymium alloy.

8. The TFT array substrate of claim 1, further comprising:
a light shading layer on the substrate; and
a second insulating layer on the light shading layer, wherein the second insulating layer is located between the substrate and the common electrode layer.

9. A liquid crystal display panel comprising a TFT array substrate having an array of pixels arranges in rows and columns, wherein the TFT array substrate comprises:
a substrate;
a common electrode layer arranged on the substrate;
a first insulating layer arranged on the common electrode layer;
an array of pixel electrodes arranged on the first insulating layer;
a plurality of via holes in the first insulating layer and between at least some of adjacent pixels; and
a plurality of common electrode lines between at least some of the rows and/or the columns of the pixels and electrically connected with the common electrode layer through the via holes;
wherein projections of data lines and/or gate lines superpose on projections of the common electrode lines in a direction perpendicular to the substrate and the via holes in the direction perpendicular to the substrate, and wherein perpendicular projections of the gate lines do not superpose on the data lines on the substrate.

10. A method of manufacturing a TFT array substrate having an array of pixels arranged in rows and columns, the method comprising:
providing a substrate;
forming a semiconductor layer, a gate, a source, a drain of a TFT, gate lines and data lines on the substrate;
forming an organic layer on the semiconductor layer, the gate, the source, the drain of the TFT, the gate lines and the data lines;
forming a plurality of first via holes on the source and the drain;
forming a common electrode layer on the organic layer;
forming a first insulating layer on the common electrode layer;
forming a plurality of second via holes in the first insulating layer at positions corresponding to the first via holes
forming a plurality of third via holes in the first insulating layer at an area free of pixels;
forming a plurality of pixel electrodes on the first insulating layer through the second via holes; and
forming common electrode lines between at least some of the rows and/or the columns of the pixels through the third via holes;
wherein projections of the data lines and/or the gate lines superpose on projections of the common electrode lines in a direction perpendicular to the substrate and the third via holes in the direction perpendicular to the substrate, and wherein perpendicular projections of the gate lines do not superpose on the data lines on the substrate.

11. The method of claim 10, further comprising, before forming the semiconductor layer:
forming a light shading layer on the substrate.

12. The method of claim 10, further comprising:
forming a third via hole in the first insulating layer between every two adjacent pixels; and
forming a common electrode line between every two adjacent rows and/or columns of pixels.

13. The method of claim 10, wherein the third via hole is a circular hole having a diameter smaller than a width of the common electrode line.

14. The method of claim 10, further comprising:
after the common electrode lines are formed, forming a metal layer or an alloy layer in direct contact with the common electrode lines.

* * * * *